United States Patent [19]

Nagano et al.

[11] Patent Number: 5,669,126
[45] Date of Patent: Sep. 23, 1997

[54] PROCESS FOR MANUFACTURING A TERMINAL FOR A PIEZOELECTRIC DEVICE

[75] Inventors: Koichi Nagano; Atsushi Uno; Toshiyuki Baba; Takashi Shimura; Yuusei Oyama, all of Nagaokakyo, Japan

[73] Assignee: Murata Manufacturing Co., Ltd., Japan

[21] Appl. No.: 523,282

[22] Filed: Sep. 5, 1995

Related U.S. Application Data

[62] Division of Ser. No. 291,126, Aug. 16, 1994, Pat. No. 5,616,981.

[30] Foreign Application Priority Data

Aug. 20, 1993 [JP] Japan .................. 5-205963
Aug. 31, 1993 [JP] Japan .................. 5-215400
Sep. 29, 1993 [JP] Japan .................. 5-242360
Nov. 18, 1993 [JP] Japan .................. 5-288882

[51] Int. Cl.[6] ............... H04R 17/00; H01R 43/16
[52] U.S. Cl. ............... 29/25.35; 29/874; 29/882; 29/885; 310/365; 310/363; 310/364; 439/884; 439/933
[58] Field of Search ............... 29/25.35, 874, 29/882, 885; 310/311, 313 R, 365, 326, 340, 363, 364; 439/886, 885, 884, 520, 522, 933

[56] References Cited

U.S. PATENT DOCUMENTS

| | | |
|---|---|---|
| 3,560,772 | 2/1971 | Lungo et al. . |
| 3,604,958 | 9/1971 | Palini . |
| 3,622,813 | 11/1971 | Kumon . |
| 3,851,194 | 11/1974 | Kawada . |
| 4,712,299 | 12/1987 | Loewen et al. ............... 29/882 |
| 4,887,347 | 12/1989 | Hikita ............... 29/882 X |
| 5,495,669 | 3/1996 | Legrady et al. ............... 29/885 |

*Primary Examiner*—Timothy V. Eley
*Attorney, Agent, or Firm*—Ostrolenk, Faber, Gerb & Soffen, LLP

[57] ABSTRACT

A terminal for a piezoelectric device has a first electrode portion, a second electrode portion folded on the first electrode portion, projections on the first and second electrode portions, and further a vibration absorber between the first and second electrode portions. As the vibration absorber, oil, a non-volatile component of oil, silicone grease, polyamide resin, paper, an anticorrosive, a coating agent, silicone rubber, etc. may be used. Another terminal for a piezoelectric device has a sealant between the first electrode portion and the second electrode portion.

5 Claims, 11 Drawing Sheets

PROCESS FOR MANUFACTURING A TERMINAL FOR A PIEZOELECTRIC DEVICE

This is a division of application Ser. No. 08/291,126, filed Aug. 16, 1994, now U.S. Pat. No. 5,616,981.

BACKGROUND OF THE INVENTION

1. Field of the Invention

The present invention relates to a terminal to be used as a component of a piezoelectric device, and more particularly to a terminal with a twofold electrode portion to be used for a piezoelectric device.

2. Description of Related Art

It is well known that a type of terminal which has a first electrode portion, a second electrode portion folded on the first electrode portion and projections provided on the first and second electrode portions is used in a piezoelectric device.

Such double-projected terminals, piezoresonators and other necessary members are piled in a box-type case to form a piezoelectric device. The piezoelectric device has a disadvantage that the output waveform is apt to fluctuate when a shock or a vibration is applied from outside. It seems that the fluctuation of the output waveform is caused by transmission of a plurality of parasitic vibrations, which occur on the piezoresonators at the time of the external shock or vibration, together with a normal-mode vibration through the terminals.

SUMMARY OF THE INVENTION

An object of the present invention is to provide a terminal for a piezoelectric device which inhibits fluctuation of the output waveform of the piezoelectric device caused by an external shock or vibration, and a manufacturing process of the terminal.

In order to attain the object, according to the present invention, a terminal for a piezoelectric device has a vibration absorber between a first electrode portion and a second electrode portion. As the vibration absorber, oil, a non-volatile component of oil, silicone grease, polyamide resin, paper, an anticorrosive, a coating agent, silicone rubber, etc. may be used.

A piezoelectric device with this terminal is unlikely to output parasitic vibrations which occur in the piezoelectric device caused by an external shock or vibration, and mainly outputs a normal-mode vibration. It may be because the vibration absorber absorbs the parasitic vibrations but hardly absorbs the normal-mode vibration. Therefore, the output waveform of the piezoelectric device with this terminal does not fluctuate so much as that of a piezoelectric device with conventional terminals.

The terminal according to the present invention further has roughness on at least one of mutually opposite surfaces of the first electrode portion and the second electrode portion. Because of the roughness, a larger quantity of material of the vibration absorber can be collected easily.

Another terminal for a piezoelectric device according to the present invention has a sealant between a first electrode portion and a second electrode portion. Because of the sealant between the electrode portions, the intrinsic resonance frequency of the terminal moves away from the resonance frequency of the piezoelectric device.

A method of producing a terminal for a piezoelectric device, according to the present invention, comprises the steps of: applying press oil which contains a non-volatile matter at a mixing ratio by weight of 1% or more onto a metal material; folding the metal material so as to form a twofold portion of a first electrode portion and a second electrode portion with the press oil in-between; and cutting a terminal with the twofold electrode portion out of the metal material.

In the method, since press oil which is conventionally used to produce a terminal is used as the material of a vibration absorber, the terminal can be produced at low costs.

BRIEF DESCRIPTION OF THE DRAWINGS

This and other objects and features of the present invention will be apparent from the following description with reference to the accompanying drawings, in which.

DETAILED DESCRIPTION OF THE PREFERRED EMBODIMENTS

Some exemplary terminals for a piezoelectric device according to the present invention and manufacturing processes thereof are hereinafter described with reference to the accompanying drawings.

First Embodiment: FIGS. 1-8

Figure 1:
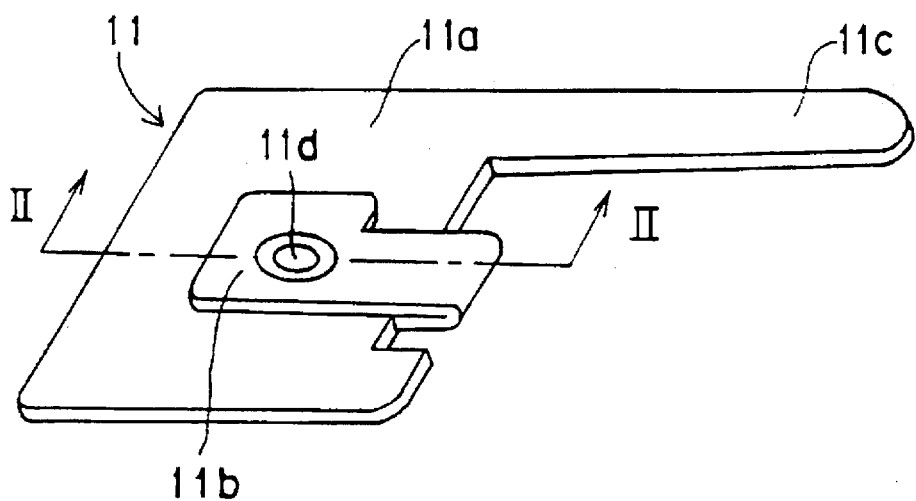
FIG. 1 is a perspective view of a terminal for a piezoelectric device which is a first embodiment of the present invention.
Figure 2:
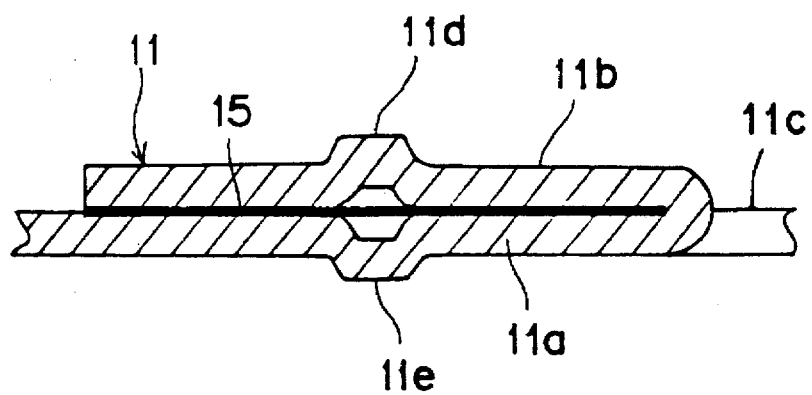
FIG. 2 is a sectional view of the terminal shown in FIG. 1, taken along a line II—II.

FIGS. 1 and 2 show a terminal 11 of a first embodiment. The terminal 11 comprises an electrode portion 11a and an electrode portion 11b folded on the electrode portion 11a, an external connecting portion 11c, and projections 11d and 11e. Further, a vibration absorber 15 is provided between the electrode portions 11a and 11b. As the vibration absorber 15, oil, a non-volatile component of oil, silicone grease, polyamide resin, paper, an anticorrosive, a coating agent, silicone rubber, etc. may be used.

Assuming that the vibration absorber 15 is press oil or a non-volatile component of press oil, the terminal 11 and a manufacturing process thereof is described.

Figure 3:
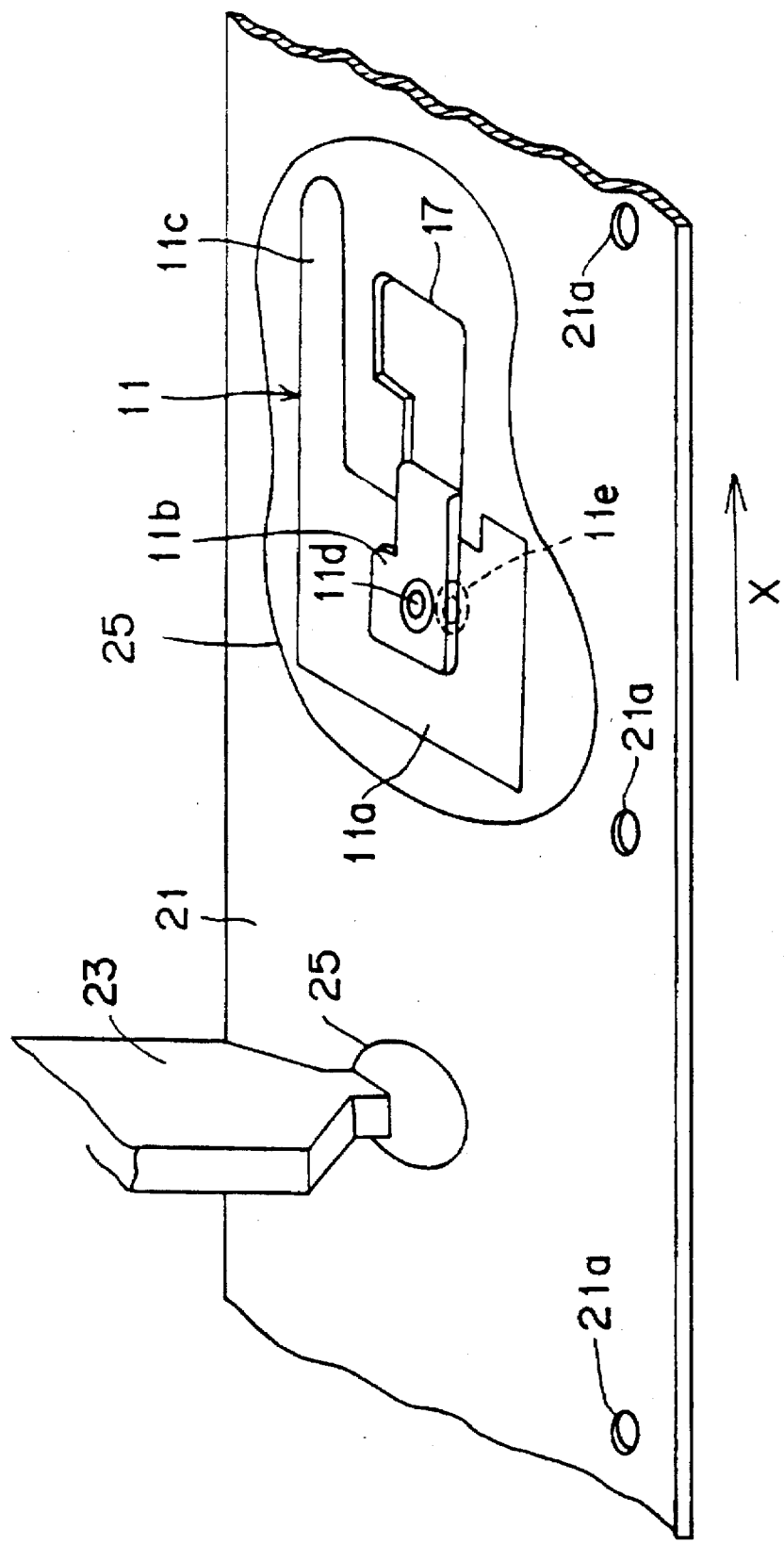
FIG. 3 is a perspective view of the terminal shown in FIG. 1, illustrating a step of a manufacturing process thereof.

As shown in FIG. 3, a belt-type metal material 21 is moved intermittently in a direction indicated with an arrow X by use of holes 21a made at a side of the metal material 21. A specified amount of press oil 25 is supplied from a press oil nozzle 23 onto a surface of the metal material 21. The press oil 25 acts as a lubricant in a cutting process and in a pressing process of press molding. The press oil 25 contains non-volatile components such as an oiliness improver and an anticorrosive at a mixing ratio by weight of 1% or more, and is of a type not requiring degreasing (cleaning), for example, G6316 (trade name) manufactured by Nihon Kosakuyu Kabushiki Kaisha. The non-volatile components of G6316 are ester polymers. The amount of press oil 25 between the electrode portions 11a and 11b which acts as the vibration absorber 15 is controllable by changing the kind and the amount of supply of the press oil 25.

Figure 4:
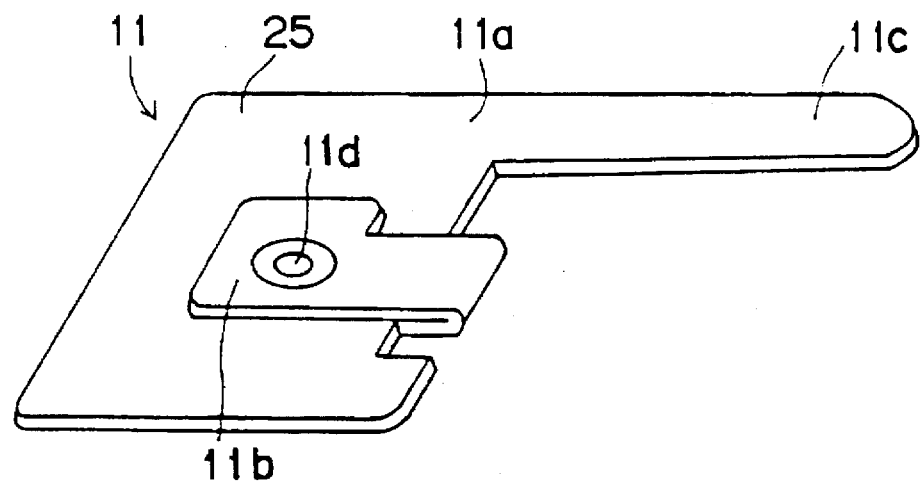
FIG. 4 is a perspective view of the terminal, illustrating a step next to the step of FIG. 3.

Next, a cut line 17 corresponding to the configuration of the terminal 11 is made in the metal material 21 by a press machine. In this moment, the press oil 25 is spread out on the metal material 21 to cover the electrode portion 11a. Then, the electrode portion 11b is folded on the electrode portion 11a by the press machine, and the press oil 25 is disposed between the electrode portions 11a and 11b. Thereafter, the terminal 11 is taken out of the metal material 21. The folding of the electrode portion 11b and the taking of the terminal 11 out of the metal material 21 are not necessarily carried out continuously and may be carried out separately as independent steps. FIG. 4 shows the terminal 11 taken out of the metal material 21.

The press oil 25 on the surface of the electrode portion 11a is volatilized. The non-volatile components of the press oil 25 in the exposed portion are apt to move to the space between the electrode portions 11a and 11b, while the press oil 25 between the electrode portions 11a and 11b is hardly volatilized. As a result, the press oil 25, and more specifically the non-volatile components of the press oil 25 are left between the electrode portions 11a and 11b as the vibration absorber 15. This method of providing a vibration absorber between the electrode portions 11a and 11b uses press oil which is conventionally used for terminal manufacturing, and therefore according to This method, a terminal for a piezoelectric device which inhibits fluctuation of the output waveform can be produced at low costs.

Because of the vibration absorber 15 between the electrode portions 11a and 11b of the terminal 11, a piezoelectric device with the terminal 11 hardly outputs parasitic vibrations which occur in the piezoelectric device caused by an external shock or vibration, and outputs a normal-mode vibration mainly. Consequently, the output waveform of the piezoelectric device with the terminal 11 fluctuates little, compared with that of a piezoelectric device with conventional terminals.

Figure 5:
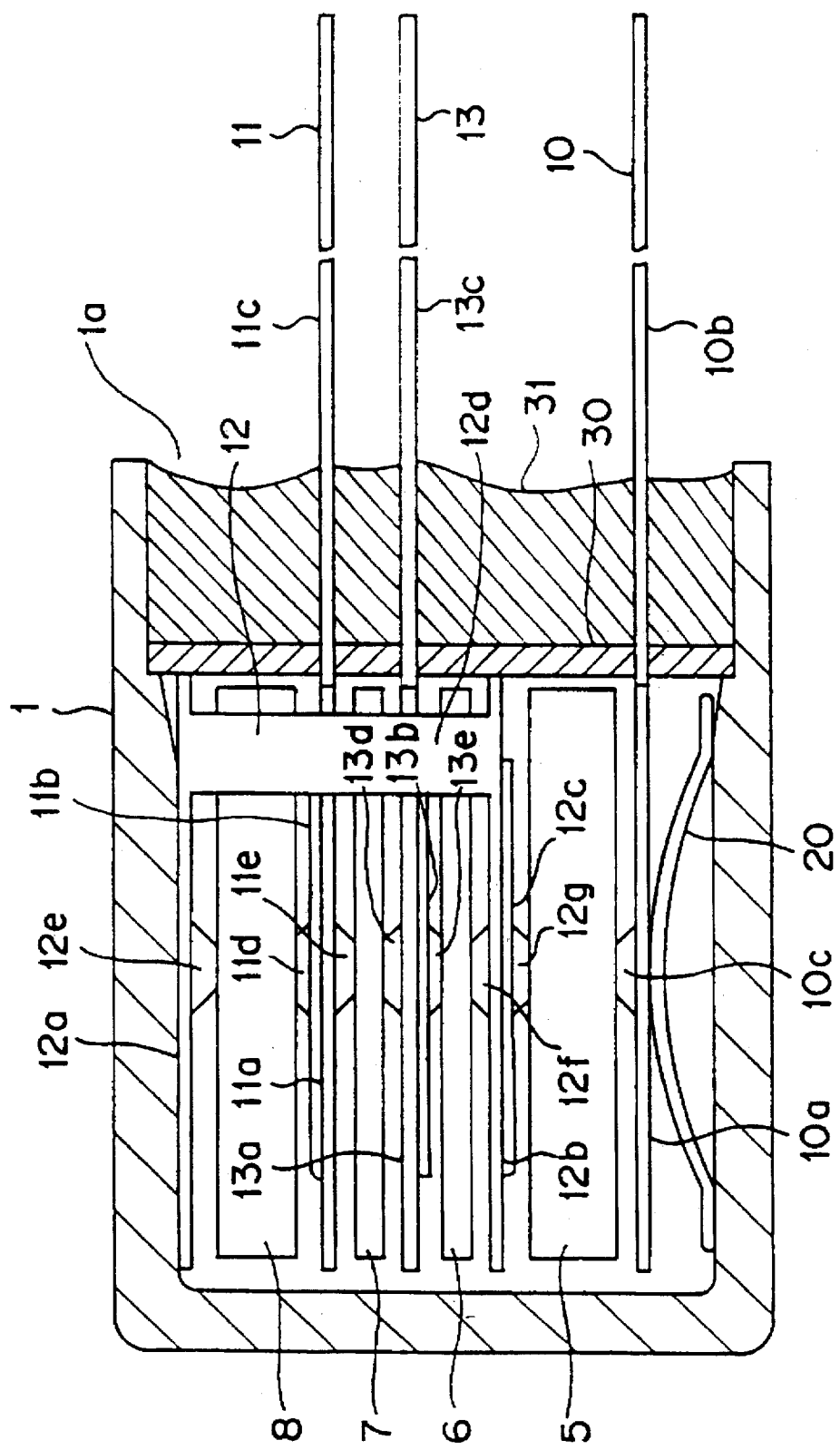
FIG. 5 is a fragmentary sectional view of a ladder filter provided with the terminal of FIG. 1.

Now, the effect of the terminal 11 is described in connection with a ladder filter which has the terminal 11 as the output terminal. FIG. 5 shows the ladder filter. The ladder filter comprises a box-type case 1, four piezoresonators 5, 6, 7 and 8, an input terminal 10, an output terminal 11 which is the above-described terminal, a relay terminal 12, a grounding terminal 13 and a spring 20. The piezoresonators 5, 6, 7 and 8 are of a conventional type which has oscillation electrodes on both sides and operates in a stretch vibration mode.

The case 1 has an opening 1a at the right side in FIG. 5, and is made of resin, ceramic or the like.

The projection 11d of the output terminal 11 is in contact with the lower side of the piezoresonator 8, and the projection 11e thereof is in contact with the upper side of the piezoresonator 7.

The input terminal 10 has an electrode portion 10a, an external connecting portion 10b and a projection 10c, and the projection 10c is in contact with the lower side of the piezoresonator 5.

The relay terminal 12 has electrode portions 12a, 12b and 12c, a relay portion 12d, and projections 12e, 12f and 12g. The projection 12e, 12f and 12g are in contact with the upper side of the piezoresonator 8, the lower side of the piezoresonator 6 and the upper side of the piezoresonator 5 respectively. The electrode portion 12c is folded on the electrode portion 12b, and a vibration absorber is provided between the electrode portions 12b and 12c.

The grounding terminal 13 has electrode portions 13a and 13b, an external connecting portion 13c, and projections 13d and 13e. The projection 13d is in contact with the lower side of the piezoresonator 7, and the projection 13e is in contact with the upper side of the piezoresonator 6. The electrode portion 13b is folded on the electrode portion 13a, and a vibration absorber is provided between the electrode portions 13a and 13b.

The piezoresonators 5 through 8 and the terminal 10 through 13 are contained in the case 1. The spring 20 is provided between the bottom wall of the case 1 and the terminal 10 to cause an appropriate pressure among the piezoresonators 5 through 8 and the terminals 10 through 13. An insulating sheet 30 is set in steps of the opening 1a of the case 1, and a resin sealant 31 is potted in the opening 1a to seal the case 1. Further, the ladder filter can be finished as a surface mounting type by, after hardening of the sealant 31, bending the external connecting portions 10b, 11c and 13c of the terminals 10, 11 and 13 along the side and the bottom of the case 1.

Figure 6:
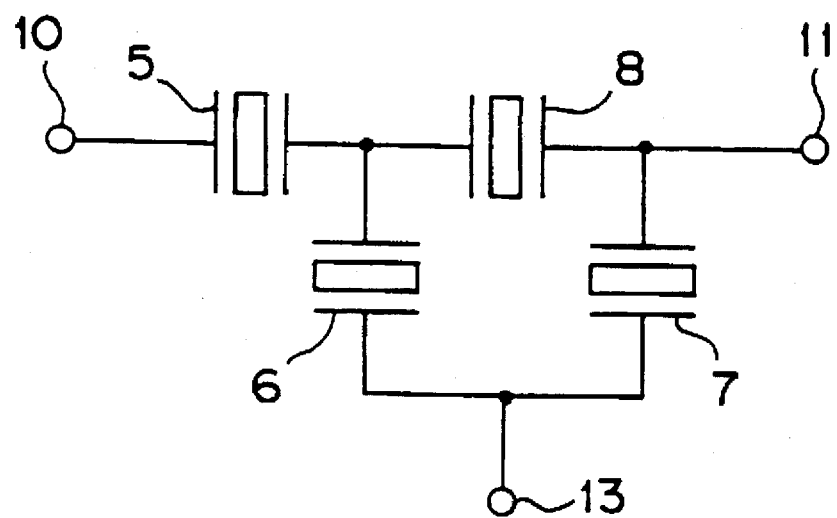
FIG. 6 is an electric equivalent circuit diagram of the ladder filter of FIG. 5.

FIG. 6 shows the electrical equivalent circuit of the ladder filter. In the circuit, between the input terminal 10 and the output terminal 11, the piezoresonators 5 and 8 are connected in series, and the piezoresonators 6 and 7 are connected in parallel, the series connections and the parallel connections being alternate. Thus, the circuit has a ladder structure.

Because of the vibration absorber 15 of the terminal 11, parasitic vibrations which occur on the piezoresonators 5 through 8 caused by an external shock or vibration are hardly sent out of the piezoelectric device, and a normal-mode vibration is mainly sent out. Consequently, the output waveform of the ladder filter fluctuates little, compared with that of a ladder filter with a conventional output terminal.

Figure 7:
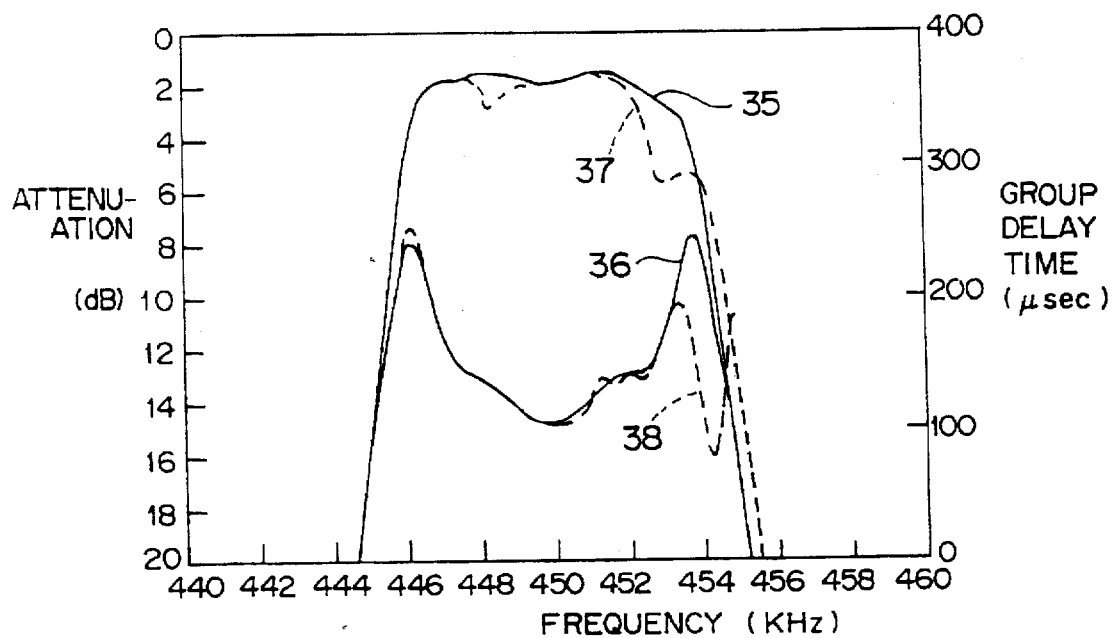
FIG. 7 is a graph showing electric characteristics of the ladder filter of FIG. 5.
Figure 8:
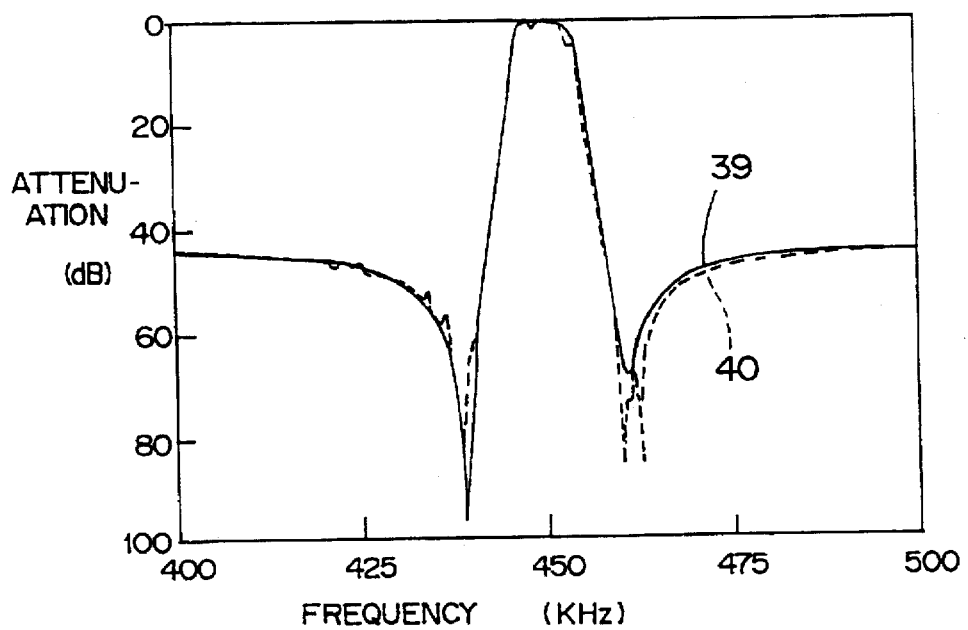
FIG. 8 is a graph showing electric characteristics of the ladder filter of FIG 5.

FIGS. 7 and 8 are graphs which show electrical characteristics of the ladder filter wherein press oil is used as the vibration absorber 15. In the graphs, the solid lines 35 and 39 indicate the attenuation, and the solid line 36 indicates the group delay time. For comparison, the graphs also show the electrical characteristics of a conventional ladder filter which has an output terminal without a vibration absorber. The dashed lines 37 and 40 indicate the attenuation, and the dashed line 38 indicates the group delay time.

Figure 9:
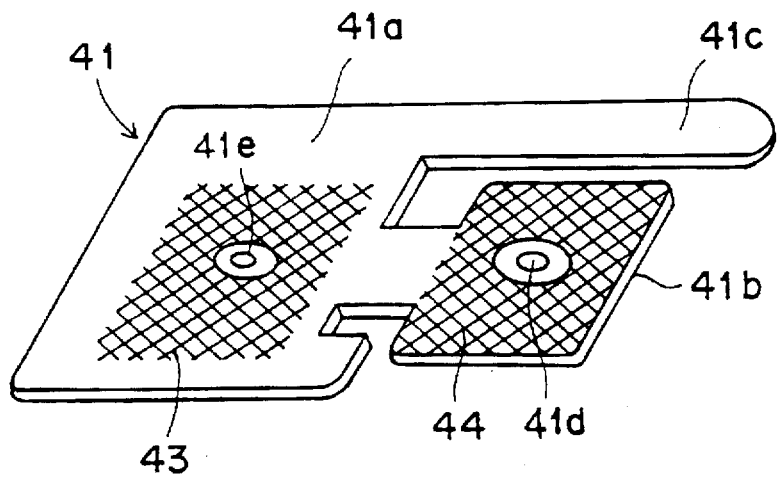
FIG. 9 is a perspective view of a terminal for a piezoelectric device which is a second embodiment of the present invention.
Figure 10:
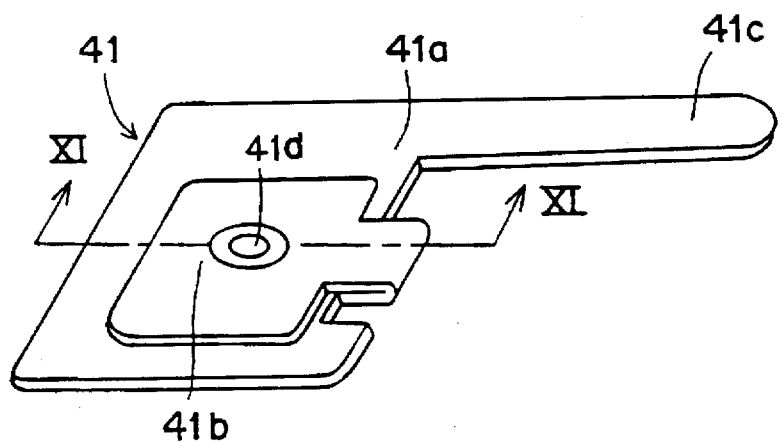
FIG. 10 is a perspective view of the terminal of FIG. 9 after folding.
Figure 11:
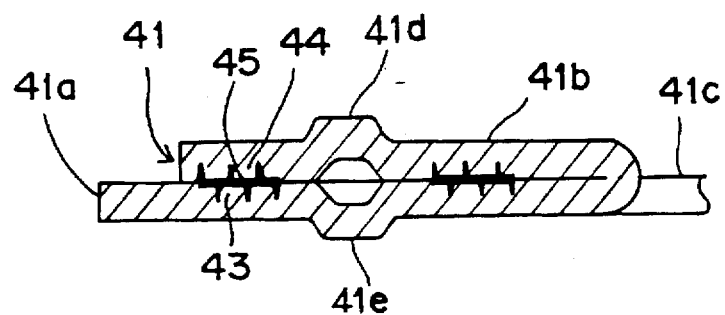
FIG. 11 is a sectional view of the terminal of FIG. 10, taken along a line XI—XI.

Second Embodiment: FIGS. 9–11

As shown in FIG. 9, a terminal 41 of a second embodiment has an electrode portions 41a and 41b, an external connecting portion 41c, and projections 41d and 41e. The surfaces of the electrode portions 41a and 41b which are to be opposite to each other have knurls 43 and 44. If each of the electrode portions 41a and 41b has a thickness of 150 μm, each of the knurls 43 and 44 has a thickness of preferably not more than 10 μm. The electrode portions 41b is folded on the electrode portion 41a as illustrated in FIG. 10. The terminal 41 of the second embodiment is provided with a vibration absorber 45 made of the press oil 25 in the same manner as described in the first embodiment, and because of the knurls 43 and 44, the press oil 25 is collected between the electrode portions 41a and 41b easily. Therefore, more press oil 25 is left between the electrode portions 41a and 41b as the vibration absorber 45, and the terminal 41 is more effective to inhibit fluctuation of the output waveform of a piezoelectric device than a terminal with a vibration absorber but without such knurls.

Figure 12:
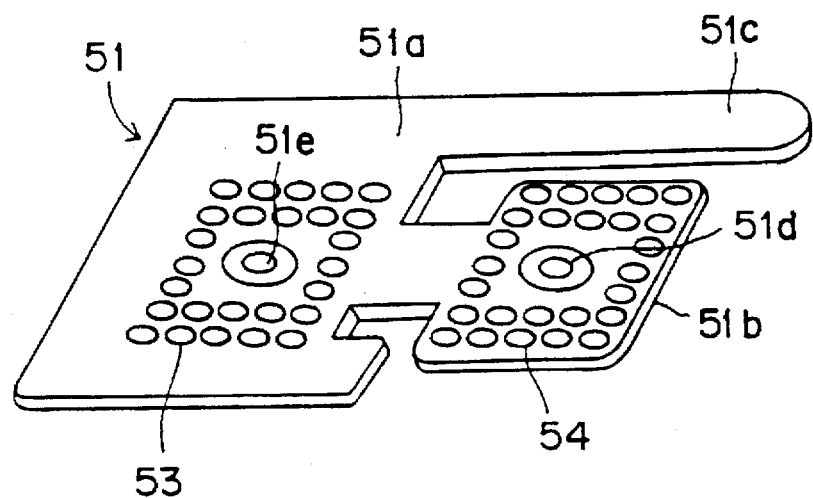
FIG. 12 is a perspective view of a terminal for a piezoelectric device which is a third embodiment of the present invention.
Figure 13:
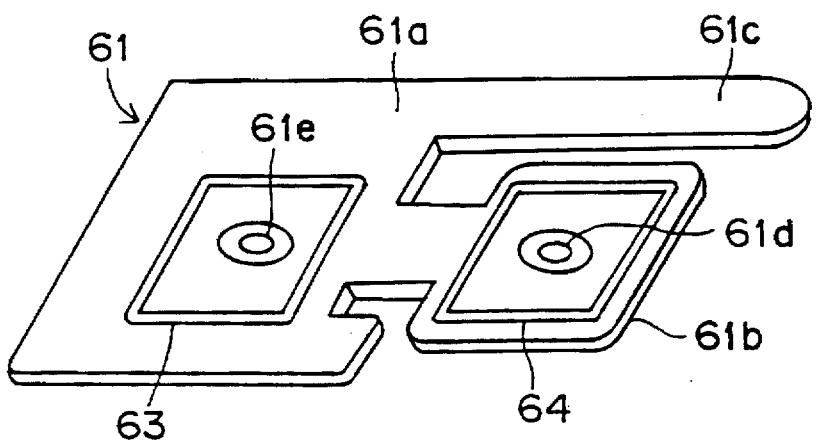
FIG. 13 is a perspective view of a terminal for a piezoelectric device which is a fourth embodiment of the present invention.
Figure 14:
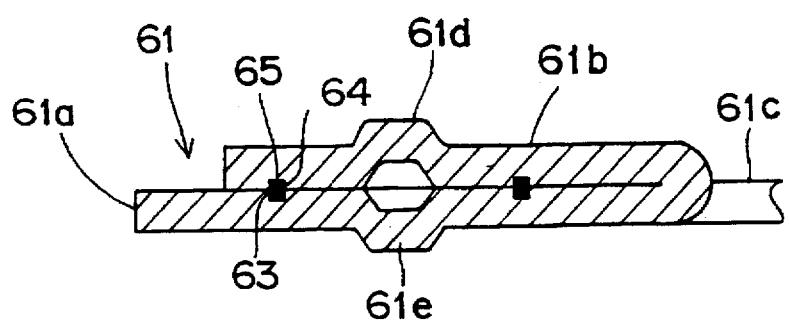
FIG. 14 is a sectional view of the terminal of FIG. 13 after folding.

Third and Fourth Embodiments: FIGS. 12–14

FIG. 12 shows a terminal 51 of a third embodiment. The terminal 51 has electrode portions 51a and 51b, an external connecting portion 51c, and projections 51d and 51e. A plurality of hemispherical hollows 53 and 54 are provided on the surfaces of the electrode portions 51a and 51b which are to be opposite to each other. The electrode portion 51b is folded on the electrode portions 51a. The terminal 51 is provided with a vibration absorber made of the press oil 25 in the same manner as described in the first embodiment. Because of the hemispherical hollows 53 and 54, the press oil 25 is collected between the electrode portions 51a and 51b easily, and more press oil 25 is left as the vibration absorber. The terminal 51 has the same effect of the terminal 41 of the second embodiment.

FIGS. 13 and 14 show a terminal 61 of a fourth embodiment. The terminal 61 has electrode portions 61a and 61b, an external connecting portions 61c, and projections 61d and 61e. The electrode portion 61b is folded on the electrode portion 61a. Grooves 63 and 64 are provided on the mutually opposite surfaces of the electrode portions 61a and 61b. The terminal 61 is provided with a vibration absorber 65 made of press oil 25 in the same manner as described in the first embodiment. Because of the grooves 63 and 64, the press oil 25 is collected between the electrode portions 61a and 61b easily, and more press oil 25 is left as the vibration absorber. The terminal 61 has the same effect as the terminal 41 of the second embodiment.

Figure 15:
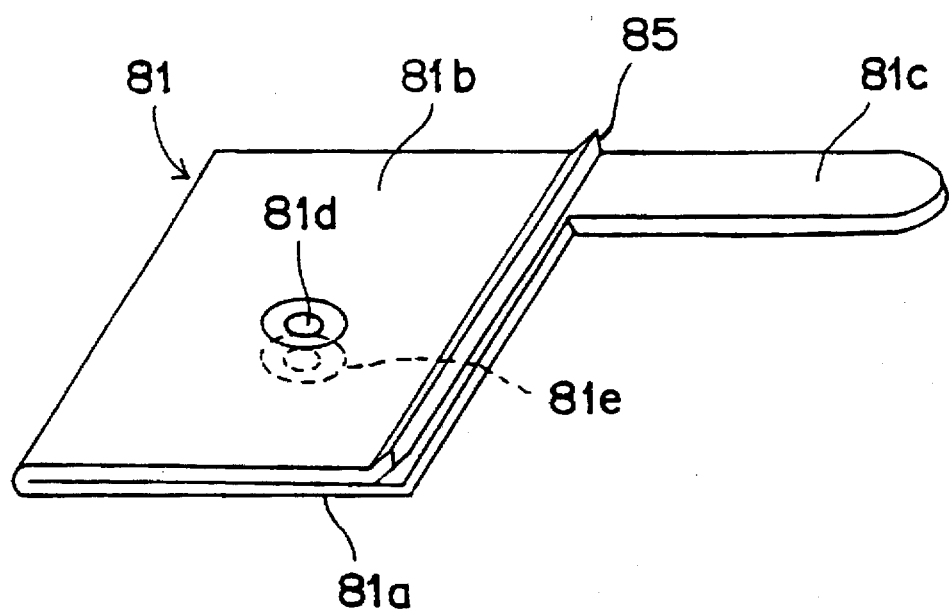
FIG. 15 is a perspective view of a terminal for a piezoelectric device which is a fifth embodiment of the present invention.
Figure 16:
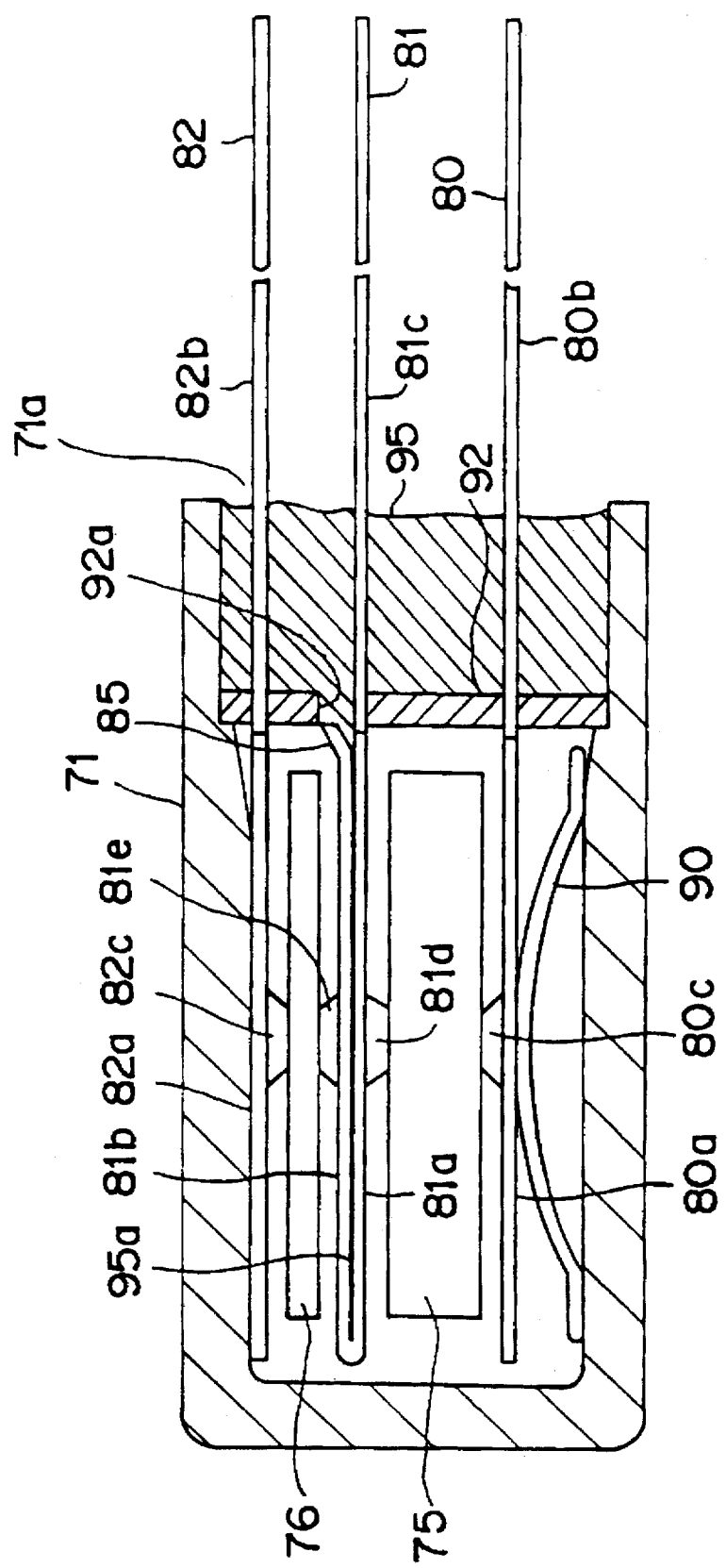
FIG. 16 is a fragmentary sectional view of a ladder filter provided with the terminal of FIG. 15.
Figure 17:
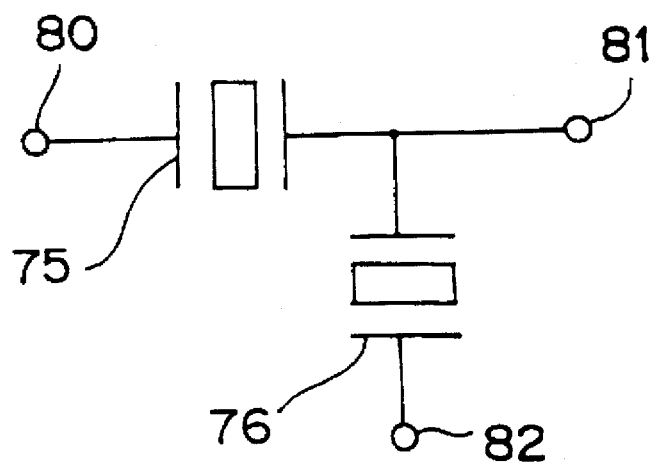
FIG. 17 is an electric equivalent circuit of the ladder filter of FIG. 16.

Fifth Embodiment: FIGS. 15–17

FIG. 15 shows a terminal 81 of a fifth embodiment. The terminal 81 has an electrode portion 81a, an electrode portion 81b folded on the electrode portion 81a, an external connecting portion 81c, and projections 81d and 81e. The electrode portion 81b has a sealant flow prevention wall 85 at the edge. The external connecting portion 81c is extended from the electrode portion 81a. As will be described later, a sealant 95 for sealing a case of a piezoelectric device partly flows between the electrode portions 81a and 81b.

Because of the sealant 95a which flew between the electrode portions 81a and 81b, the resonance frequency of the terminal 81 changes and moves away from the resonance frequency of a piezoelectric device. Thus, a piezoelectric device improves its resonance frequency characteristics by having the terminal 81.

Now, the effect of the terminal 81 is described in connection with a ladder filter which has the terminal 81 as the output terminal.

As shown in FIG. 16, the ladder filter comprises a box-type case 71, two piezoresonators 75 and 76, an input terminal 80, an output terminal 81 which is of the fifth embodiment, a grounding terminal 82 and a spring 90. The piezoresonators 75 and 76 are of a conventional type which has oscillation electrodes on both sides and operates in a stretch vibration mode.

The case 71 has an opening 71a at the right side in FIG. 16. The case 71 is made of resin, ceramic or the like.

The projection 81d of the output terminal 81 is in contact with the upper side of the piezoresonator 75, and the projection 81e is in contact with the lower side of the piezoresonator 76.

The input terminal 80 has an electrode portion 82a, an external connecting portion 80b and a projection 80c. The projection 80c is in contact with the lower side of the piezoresonator 75.

The grounding terminal 82 has an electrode portion 82a, an external connecting portion 82b and a projection 82c. The projection 82c is in contact with the upper side of the piezoresonator 76.

The piezoresonators 75 and 76, and the terminals 80 through 82 are contained in the case 71. The spring 90 is provided between the bottom wall of the case 71 and the terminal 80 to cause an appropriate pressure among the piezoresonators 75, 76 and the terminals 80 through 82. An insulating sheet 92 is set in steps of the opening 71a of the case 71, and a sealant 95 which is made of a thermosetting resin or the like is potted in the opening 71a to seal the case 71.

The sealant 95 partly flows between the electrode portions 81a and 81b of the terminal 81 through a hole 92a made in the insulating sheet 92. Meanwhile, the sealant flow prevention wall 85 of the terminal 81 prevents the sealant 95 from flowing onto the outer surface of the electrode portion 81b. Then, the case 71 is heated by hot air, and thereby the sealant 95 is hardened. Thus, the terminal 81 obtains a sealant 95a between the electrode portions 81a and 81b easily.

FIG. 17 shows the electric equivalent circuit of the ladder filter. The circuit has a ladder structure wherein the piezoresonators 75 and 76 are connected in series and in parallel respectively between the input terminal 80 and the output terminal 81.

Since the terminal 81 has the sealant 95a between the electrode portions 81a and 81b, the intrinsic resonance frequency of the terminal 81 moves away from the resonance frequency of the ladder filter. Therefore, the resonance frequency of the ladder filter is less influenced by the terminal 81, compared with a conventional terminal.

Figure 18:
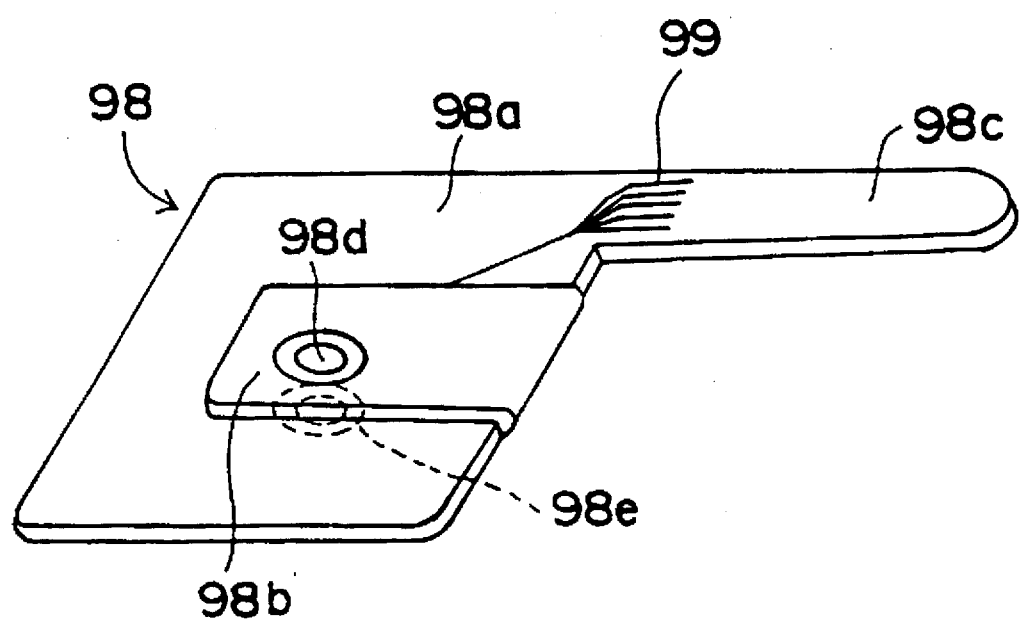
FIG. 18 is a perspective view of a terminal for a piezoelectric device which is a sixth embodiment of the present invention.

Sixth Embodiment: FIG. 18

FIG. 18 shows a terminal 98 of a sixth embodiment. The terminal 98 has electrode portions 98a and 98b, an external connecting portion 98c, and projections 98d and 98e. The electrode portion 98b is folded on the electrode portion 98a, and a narrow groove 99 for leading a sealant between the electrode portions 98a and 98b is provided on the upper surface to extend from the external connecting portion 98c to the electrode portion 98a. The groove 99 branches at one end portion and reaches the twofold portion of 98a and 98b at the other end.

The terminal 98 is contained in a case of a piezoelectric device in the same manner as described in the fifth embodiment. The sealant 95 used for sealing of the case partly flows into the groove 99 by capillarity and is led between the electrode portions 98a and 98b. Thus, the terminal 98 obtains a sealant between the electrode portions 98a and 98b easily. The terminal 98 has the same effect as the terminal 81 of the fifth embodiment.

Other Embodiments

In the ladder filter described in the first embodiment, all the terminals with a twofold portion have a vibration absorber, but it is not necessary to provide the vibration absorber to all the terminals. It is sufficient to provide one of the output terminal, the relay terminal and the grounding terminal with a vibration absorber, whereas it is the most effective to provide a vibration absorber to the output terminal. The configurations of the terminals are not limited to those of the embodiment.

The roughness formed on the mutually opposite surfaces of the twofold portion is not limited to have the configurations described in the second, the third and the fourth embodiments. For example, in the fourth embodiment, grooves are provided on both of the opposite surfaces of the twofold portion, but it is possible to provide a protrusion on one of the surfaces instead of the groove.

Although the present invention has been described in connection with the preferred embodiments above, it is to be noted that various changes and modifications are possible to those who are skilled in the art. Such changes and modifications are to be understood as being within the scope of the present invention.

What is claimed is:

1. A method of producing a terminal for a piezoelectric device, the method comprising the steps of:

applying press oil which contains at least 1 weight percent of non-volatile components onto a metal material;

folding the metal material so as to form a twofold portion of a first electrode portion and a second electrode portion with the press oil in-between; and cutting a terminal with the twofold electrode portion out of the metal material.

2. The method of claim 1, wherein said non-volatile components are selected from the group consisting of oiliness improvers and anticorrosives.

3. The method of claim 2, wherein said non-volatile components include an ester polymer.

4. The method of claim 1, wherein said non-volatile components include an ester polymer.

5. The method of claim 1, wherein said press oil is a type not requiring degreasing.

* * * * *